United States Patent [19]

Manfreda

[11] 4,175,254
[45] Nov. 20, 1979

[54] SELECTIVELY TUNABLE HETERODYNE RECEIVER

[75] Inventor: Alfred Manfreda, Germering, Fed. Rep. of Germany

[73] Assignee: Siemens Aktiengesellschaft, Berlin & Munich, Fed. Rep. of Germany

[21] Appl. No.: 903,255

[22] Filed: May 5, 1978

Related U.S. Application Data

[63] Continuation of Ser. No. 666,182, Mar. 12, 1976, abandoned.

[30] Foreign Application Priority Data

Mar. 13, 1975 [DE] Fed. Rep. of Germany ....... 2511027

[51] Int. Cl.² .............................................. H04B 1/26
[52] U.S. Cl. .............................. 325/433; 324/78 D; 324/79 D; 325/455; 331/64
[58] Field of Search ............... 325/334, 335, 452, 453, 325/345, 346, 416, 431–455; 331/38–41, 46, 48, 177 V, 64; 324/79 R, 79 D, 78 R, 78 D

[56] References Cited

U.S. PATENT DOCUMENTS

| | | |
|---|---|---|
| 2,654,832 | 10/1953 | Robinson .......................... 325/432 |
| 3,569,838 | 3/1971 | Blair et al. ......................... 325/433 |
| 3,569,865 | 3/1971 | Healey .............................. 331/177 V |
| 3,938,048 | 2/1976 | Elliott ................................ 325/455 |
| 4,061,980 | 12/1977 | Sato .................................. 325/455 |
| 4,114,101 | 9/1978 | Sekiguchi ........................... 325/455 |

FOREIGN PATENT DOCUMENTS 1190522 4/1965 Fed. Rep. of Germany .......... 325/455

Primary Examiner—Marc E. Bookbinder
Attorney, Agent, or Firm—Hill, Van Santen, Steadman, Chiara & Simpson

[57] ABSTRACT

A selectively tunable heterodyne receiver including a plurality of frequency conversion stages which can be tuned to a desired receiving frequency by the use of two voltages which control the coarse and fine tuning adjustments and wherein the first voltage is supplied to a first injection oscillator to control the harmonic output of a crystal controlled harmonic generator and wherein the second voltage is supplied to a second injection oscillator which is continuously variable within a frequency range corresponding to the frequency spacing between the adjacent harmonics of the harmonic generator and wherein the second oscillator is stabilized to the desired adjusted frequency.

6 Claims, 1 Drawing Figure

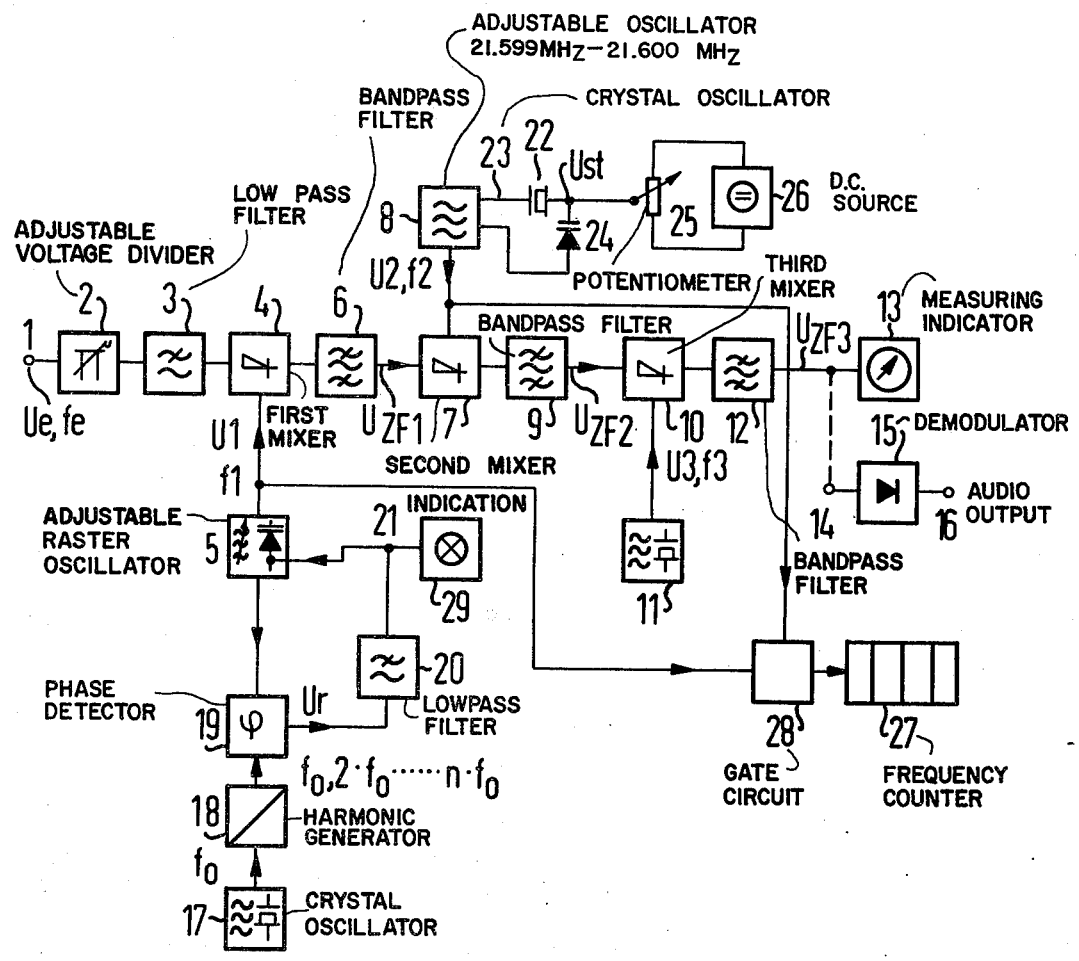

SELECTIVELY TUNABLE HETERODYNE RECEIVER

This is a continuation, of application Ser. No. 666,182, filed Mar. 12, 1976, now abandoned.

BACKGROUND OF THE INVENTION

1. Field of the Invention

The present invention relates to tuning systems for selectively tunable heterodyne receivers.

2. Description of the Prior Art

Tunable super heterodyne receivers are known and an example is disclosed in German Patent No. 1,076,265. The receiver in this patent includes a number of frequency conversion stages with the second injection oscillator having its output signal converted to a significantly lower frequency position by an additional interpolation oscillator by means including a frequency stabilized auxiliary voltage. The second oscillator has its frequency adjusted to the value of the adjusted frequency of the interpolation oscillator by use of an automatic frequency control system. Thus, if the output frequency of the second oscillator is reduced by at least a factor of $10^2$ and if this frequency band tuning range of the interpolation oscillator is selected to be correspondingly low, the second oscillator may be adjusted with the use of the interpolation oscillator to a precise frequency. However, in spite of the continuous frequency variation, the individual frequencies of the second oscillator are as stable as if they were controlled by a crystal oscillator. Thus, this receiver has a very high tuning accuracy and stability for the heterodyne receiver with respect to each random tuning frequency within a given frequency range. The indication of the coarse tuning takes place on a coarse tuning scale associated with the first injection oscillator and the indication of the fine tuning occurs on the tuning scale associated with the interpolation oscillator. However, particularly due to the stabilization measures of such prior art systems, the cost of the receiver of the prior art is very high and the system is relatively complicated.

SUMMARY OF THE INVENTION

The present invention relates to a selectively tunable heterodyne receiver having one or more frequency conversion stages which are tuned to a desired fe receiving frequency by the use of two voltages which control the adjustable frequency of separate coarse and fine adjustment tuning means. The first voltage is supplied by a first oscillator which has a frequency which can be adjusted and locked to the harmonic waves of a crystal oscillator having a harmonic output and the second voltage is supplied by a second oscillator which is continuously tunable within a frequency range which varies between the frequency spacing of the adjacent harmonics of the first oscillator and wherein the second oscillator is stabilized to the desired adjusted frequency.

The stabilization of the continuously adjustable second oscillator reduces frequency errors which without stabilization would lie in the order of $10^{-3}$ of its output frequency. The frequency error of the first oscillator in the locked in state is in the order of magnitude of $10^{-5}$ of its output frequency even where temperature stabilization is not utilized. Therefore, the invention provides a very stable tuning system for a receiver and the significance of the stabilization system is very good even for the higher frequencies emitted by the second oscillator.

It is an object of the present invention to provide a selectively tunable heterodyne receiver which is capable of high tuning precision and which has high tuning stability but which is significantly lower in cost than receivers of the prior art.

In the present invention the second injection oscillator utilizes a crystal oscillator which stabilizes the frequency of the oscillator to a stable value and which is designed so that it can be continuously adjustable over a frequency range with the use of an adjustment device which shifts the stable frequency over an adjustment range which is very small and which covers the frequency spacing between the adjacent harmonics of the crystal controlled harmonic output of the first oscillator. The frequency spacing between the adjacent harmonics of the crystal oscillator control of the first oscillator is selected so that it is small enough so that it does not exceed the width of the adjustment range of the second oscillator. A frequency counter receives outputs from the first and second oscillators and indicates the frequency of the system as derived from these two outputs.

The invention utilizes a frequency counter for indicating the selected receiving frequency to which the receiver is tuned and the first oscillator can be adjusted to individual frequency positions which are much more accurate than was previously possible with coarse tuning systems of the prior art. Therefore, it is possible to reduce the crystal fundamental frequency of the frequency spacing of the adjacent harmonics to such an extent that even though the second oscillator is crystal stabilized to a stable frequency its frequency can be shifted so as to interpolate with the use of an adjustment device to continuously adjustable intermediate values lying between adjacent harmonics of the first oscillator. The adjustment device permits only relatively small shifts in the fundamental frequency but these are enough to cover the frequency spacing between adjacent harmonics of the first oscillator.

The advantage which can be achieved with the aid of the invention is that great tuning accuracy and tuning stability of the selective heterodyne receiver is accomplished which requires much simpler stabilization measures for the second oscillator than has been required by prior art devices. For example, the interpolation oscillator which controls the second oscillator and the frequency control system for the heterodyne receiver such as shown in German Patent No. 1,076,265 which are required to convert the output frequency of the second oscillator to the frequency band which is required of the interpolation oscillator are eliminated by the present invention.

So as to continuously adjust the frequency output of the second oscillator in a very simple manner a preferred embodiment of the invention utilizes an adjustment device which consists of a voltage controlled capacitor which in a particular embodiment can be a capacitive diode which is arranged in the frequency determining circuit of the oscillator and is connected to the frequency adjusting terminal of the oscillator.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure, and in which

BRIEF DESCRIPTION OF THE DRAWING

The drawing is a block diagram of the novel tunable receiver of the invention.

DESCRIPTION OF THE PREFERRED EMBODIMENTS

The FIGURE illustrates a receiver which has an input terminal 1 which supplies an input to an attenuating device which may be an adjustable voltage divider 2. A low pass filter 3 receives the output of the divider 2 and supplies an input to a first mixer 4 which comprises the first conversion stage of the receiver. A raster oscillator supplies a voltage U1 at a frequency f1 to the mixer 4 from the oscillator 5. The voltage received at input terminal 1 is designated as Ue at a frequency of fe and is mixed with the voltage U1 in the mixer 4. The output of the first mixer 4 is supplied to a band pass filter 6 which passes a first IF voltage $U_{ZF1}$ to a second mixer or conversion stage 7. A second oscillator 8 supplies an input U2, f2 to the second mixer 7 and the second mixer converts the input $U_{ZF1}$ to a second intermediate frequency signal $U_{ZF2}$ which passes through a band pass filter 9 which filters out other modulation products to define the second IF band. The frequency of the oscillator 8, f2 is continuously adjustable within the frequency band corresponding to the distance between two adjacent frequencies f1 of the output of the raster oscillator 5 and the oscillator 8 is utilized for the purpose of fine tuning the heterodyne receiver.

The second IF signal $U_{ZF2}$ is supplied to a third mixer or conversion stage 10 which receives an input from a third oscillator 11 which supplies an output signal U3 at a frequency f3 and a band pass filter 12 receives the output of the mixer 10 and passes the signal $U_{ZF3}$ to a measuring and indicating meter 13. The output of the band pass filter 12 is also supplied to an input terminal 14 of a demodulator 15 which supplies an audio output signal at its output terminal 16. The measuring and indicating meter 13 analyzes either the amplitude and/or phase of the received voltage Ue. This indicator 13 can also analyze the phase of a significantly lower frequency voltage which has been modulated upon the received voltage Ue. The meter 13 can also analyze the received voltage Ue which may be a carrier frequency modulated with a low frequency intelligent signal and in this case the output signal $U_{ZF3}$ will be supplied to the input 14 of the demodulator 15 which produces a demodulated output intelligent signal at terminal 16 which can be supplied to an audio frequency stage, not shown. The output audio frequency from the audio frequency stage can be utilized in a known fashion.

The first oscillator 5 is a raster oscillator which can be adjusted and locked to each random harmonic of a crystal oscillator 17 which produces an output $f_o$. The output of the crystal oscillator 17 is supplied to a harmonic generator 18 which produces a plurality of output harmonics $f_o, 2f_o, \ldots nf_o$ which is supplied to the input of a phase detector 19. The phase detector 19 also receives an output from the oscillator 5 and the phase detector 19 will produce an alternating voltage $U_r$ which is supplied to a low pass filter 20 which supplies an output to the input terminal 21 of the frequency and phase adjusting terminal of oscillator 5 so as to vary its frequency f1 until it corresponds to the respective harmonic at the output of the harmonic generator 18.

Once the output of the oscillator 5 has been synchronized with the output of the phase detector 19 which means that it has been locked in with one of the harmonics from the harmonic generator 18, the phase detector 19 will produce a direct current voltage $U_r$ which depends upon the phase difference between the input voltages having the same frequency applied to the phase detector 19. The voltage $U_r$ thus functions as a control AFC voltage which prevents any deviation of the oscillator 5 from the desired frequency or from the selected harmonic and, thus, ensures and maintains the oscillator 5 locked to the particular harmonic. Since there are many harmonics at the output of the harmonic generator 18 it is possible for the oscillator 5 to be tuned to a large frequency range.

The output frequency f2 of the second oscillator 8 may be continuously adjusted within the frequency band which corresponds in size to the fundamental frequency $f_o$ of the crystal oscillator 17. This frequency band also corresponds to the frequency spacing between two adjacent harmonics of $f_o$. The high precision and stability of the oscillator 8 and the corresponding output frequency f2 results because the crystal 22 stabilizes the frequency determining circuits at the input 23 of the oscillator 8 to a stable frequency. In other words, the output of the crystal 22 controls the frequency determining circuits of the oscillator 8 and with the aid of a frequency adjustment device which consists of the voltage controllable capacitive diode 24 the frequency of the crystal 22 can be shifted over an adjustment range. The adjustment of the frequency f2 can be adjusted by the use of a potentiometer 25 which is supplied a signal from the direct current source 26 and thus by setting the potentiometer 25 to different voltages, different control voltages Ust are applied to the variable capacitive diode 24 to thus change the output frequency of the oscillator 8. The adjustment circuitry can be designated as a pulling device and would generally consist of a voltage variable capacitance or an inductive reactance arrangement which may be adjusted to various reactants values by means of a control voltage.

A prerequisite for a continuous tunable super heterodyne receiver is that the frequency spacing between adjacent harmonics of $f_o$ be selected small enough such that it does not exceed the tuning adjustment range of the stable frequency oscillator 8, and this condition is met in the present invention.

A frequency counter 27 which indicates the frequency of the received signal fe which has been selected in view of the respective tunings of the oscillators allows precise and unambiguous settings of the oscillator 5 to individual frequency positions which are necessary for this purpose. The counter 27 may be directly driven by the outputs of the oscillators 5 and 8 which are supplied to the gate circuit 28 which produces an output to the counter 27. One of the outputs from oscillators 5 or 8 as, for example, the output f2 of the oscillator 8 is used to control the gate 28 so that the oscillations of the other oscillator 5, f1, are supplied and counted by the counter 27. From the results indicated by the counter the frequency difference between f1 and f2 allows a constant number of counts to be obtained which correspond to the center frequency of the intermediate frequency band ZF2. The counter 27 may be preadjusted for this purpose, for example.

The individual harmonics of the frequency $f_o$ from the harmonic generator 18 are located in the capture ranges having widths which correspond to approximately double the cut-off frequency of the low pass filter 20. Thus, the frequency f1 is locked to a harmonic when the respective capture range is reached. A locking or retention range is associated with each harmonic and as this retention range is exceeded the locking of the output of the oscillator 5 with the particular harmonic is cancelled. Thus, the frequency output of the oscillator 5 changes between each retention range and the adjacent locking ranges and between these no locked position occurs. An indicator device such as an indicator lamp 29 can be turned on or off upon the disappearance of the output of the low pass filter 20 to indicate the locked position of the oscillator 5. However, as a specific preferred embodiment of the invention, the retention ranges are selected to be sufficiently large that they reach or even partially overlap the adjacent capture ranges. In such instance, the indicator device 29 may be eliminated since the oscillator 5 will lock in position at any random setting to a particular harmonic.

If the tuning of the heterodyne receiver is to remain stable over a long period of time it may be desirable to significantly expand the retention ranges assigned to the individual harmonics of $f_o$ after the adjustment of oscillator 5 has been made. This will assure that the locked positions of the oscillator 5 will be particularly stable and the oscillator 5 will change its frequency only after departure from these expanded retention ranges. However, it is desirable and necessary to reduce extensive overlapping of expanded retention zones to their normal width during the adjustment of frequency of the oscillator 5.

The frequency ranges which can be swepted over by the oscillators 5 and 8 may be arranged generally so that they as well as the first intermediate frequency band ZF1 are located above the frequency range of the received frequency fe. In particular it is possible to pick ranges such that they are adapted to the corresponding frequency ranges of two similarly constructed transmitting oscillators in the transmitter. The adjustable transmitting frequency is obtained by means of subtracting the output frequencies of such oscillators in the transmitter. For example, the frequency range of the first oscillator 5 would correspond to the frequency range of the first transmitting oscillator and the frequency range of the second oscillator would be the frequency range of the second transmitting oscillator shifted by the mount of the center frequency of the second IF band ZF2. Thus, an easily synchronized transmitter-receiver arrangement is obtained wherein tuning of the transmitter may optionally be jointly undertaken by the receiver or vice versa.

Arrangements of this type are particularly advantageous in carrying out measurements of the transmission parameters of an interconnected four pole network whereby the pass band of filter 12 may be designed to have an extremely narrow band.

A particular advantage of the heterodyne receiver of the invention is that due to the high tuning accuracy and stability of the receiver the pass band filter 12 may be designed to have an extremely narrow band width without interfering or impairing the tuning function. Basically, this is of importance in the use of all measurement circuits of communication engineering and specifically wherein the selection and analysis of sinusoidal measuring voltages $U_e$ are required.

In a specific embodiment of the invention a super heterodyne receiver utilizing a fundamental crystal frequency $f_o$ of one kHz was utilized. The harmonics of this fundamental frequency lying between 24 MHz and 42 MHz were used as frequencies for locking the oscillator 5. The oscillator 8 was stabilized to a frequency f2 of 21.6 MHz by the crystal oscillator 22. Oscillator 8 was constructed to be continuously adjustable in the frequency range of 21.599 MHz to 21.6 MHz by means of adjustment of the tuning devices 24, 25 and 26. Thus, a tuning range for receiving frequencies fe of 1 kHz to 18 MHz was obtained and said tuning range was capable of being swept over a frequency band continuously and with the accuracy of a crystal. It is to be realized, of course, that the specific numerical values of this receiver are intended only as examples for further explanation of the invention and no limitation of the frequency range or values is to be construed from the giving of these examples.

The receiver of the invention may be employed in circuits for measuring the response of receivers. Particularly, it may be expedient to switch the automatic control loop of the oscillator 5 to a position so that it is inoperative by disconnecting the output of the phase detector 19 to the frequency control input 21 of oscillator 5. A switch S1 may be connected between terminal 21 and oscillator 5 for this purpose. An input to cause the oscillator 5 to sweep over a desired frequency range may be supplied to a second input for controlling the frequency of oscillator 5. In such embodiment the fine adjustment of oscillator 8 remains unchanged.

Although the invention has been described with respect to preferred embodiments, it is not to be so limited as changes and modifications may be made which are within the full intended scope as defined by the appended claims.

I claim as my invention:

1. A tunable heterodyne receiver receiving an input signal and having at least two conversion stages which utilizes separate coarse and fine tuning and which can be set to a desired received frequency by first and second adjustable variable frequency signals including first and second mixers, a first adjustable injection oscillator developing said first signal which can be adjusted and locked to the harmonics of a fundamental frequency derived from a first crystal, said first mixer receiving said input signal and an input from said first injection oscillator to produce an output signal in a first intermediate frequency band, a second injection oscillator having a frequency determining circuit and developing said second signal which is continuously adjustable within a frequency range corresponding to the frequency spacing between adjacent harmonics of said first crystal, a second crystal in said frequency determining circuit for stabilizing its frequency to a stable frequency, an adjustment means connected to said second crystal oscillator for shifting its stable frequency over a continuously adjustable range which is very small in comparison to its nominal frequency, the frequency spacing between adjacent harmonics of the output of said first crystal oscillator fundamental frequency which control said first injection oscillator selected to be small enough that such spacing does not exceed the width of the adjustment range of said stable frequency of said second crystal oscillator, said second mixer receiving said first mixer output signal and said second variable frequency signal and a frequency counting means deriving the selected received frequency from the frequencies of said first and second injection oscillators, and wherein said adjustment means consists of a voltage controlled capacitive diode connected in the frequency-determining circuit of said second injection oscillator, and an adjustable voltage source connected to said diode, wherein the output of said second mixer comprises a second intermediate frequency band, the output of one of said first and second injection oscillators is supplied to said frequency counting means, said frequency counting means including a gate circuit which is opened by a signal from the other of said first and second injection oscillators whereby a counted output is obtained which corresponds to the frequency of the input signal and wherein said frequency counting means includes a preadjusted counter enabling indication of said selected received frequency.

2. A heterodyne receiver according to claim 1 wherein said first injection oscillator can be continuously and periodically swept in frequency.

3. A heterodyne receiver according to claim 1 in which said frequency counting means is preadjusted to a count value corresponding to the center frequency of said second intermediate frequency band.

4. A heterodyne receiver according to claim 1 wherein the retention range of said first injection oscillator is selected to cover or partially overlap the pull-in ranges of adjacent locking positions.

5. A heterodyne receiver according to claim 4 wherein the retention ranges of the individual locking positions of said first injection oscillator can be varied and enlarged.

6. A heterodyne receiver according to claim 1 wherein the frequency adjustment ranges of said first and second injection oscillators and the output of said first mixer are at higher frequencies than said input signal.

* * * * *